United States Patent
Wedowski et al.

(10) Patent No.: US 7,060,993 B2
(45) Date of Patent: Jun. 13, 2006

(54) DEVICE, EUV-LITHOGRAPHIC DEVICE AND METHOD FOR PREVENTING AND CLEANING CONTAMINATION ON OPTICAL ELEMENTS

(75) Inventors: Marco E. Wedowski, Aalen (DE); Frank Stietz, Lauchheim (DE); Bas M. Mertens, The Hague (NL); Roman Klein, Berlin (DE)

(73) Assignee: Carl Zeiss SMT AG (DE)

( * ) Notice: Subject to any disclaimer, the term of this patent is extended or adjusted under 35 U.S.C. 154(b) by 9 days.

(21) Appl. No.: 10/506,555

(22) PCT Filed: Mar. 7, 2003

(86) PCT No.: PCT/EP03/02372

§ 371 (c)(1), (2), (4) Date: Sep. 2, 2004

(87) PCT Pub. No.: WO03/075098

PCT Pub. Date: Sep. 12, 2003

(65) Prior Publication Data
US 2005/0104015 A1  May 19, 2005

(30) Foreign Application Priority Data
Mar. 7, 2002 (DE) ............................... 102 09 493

(51) Int. Cl.
*G03F 7/20* (2006.01)
*B08B 7/00* (2006.01)
*G01N 23/227* (2006.01)

(52) U.S. Cl. .................... 250/492.2; 250/492.1; 250/306; 250/307; 378/34; 134/1; 134/21; 134/31; 134/39

(58) Field of Classification Search ........................ None
See application file for complete search history.

(56) References Cited

U.S. PATENT DOCUMENTS

| 4,998,019 A | 3/1991 | Stokowski et al. |
| 5,393,980 A * | 2/1995 | Yost et al. ................. 250/306 |

(Continued)

FOREIGN PATENT DOCUMENTS

| DE | 41 06 841 A1 | 9/1992 |
| EP | 0 987 601 A2 | 3/2000 |
| JP | 62051224 | 3/1987 |
| JP | 2000 346817 | 12/2000 |

OTHER PUBLICATIONS

"Soft X-Ray and EUV Imaging Systems II", Daniel A. Tichenor, James A. Folta, *Proceedings of The International Society of Optical Engineering*, Jul. 31-Aug. 1, 2001, San Diego, USA, vol. 4506, pp. 93-104.

Samal, E.; Becker, W.: "An Outline of Practical Control Engineering" (Grundriss der praktischen Regelungstechnik, Oldenbourg Verlag), pp. 306-307 (1993). (with translation).

*Primary Examiner*—Jack I. Berman
(74) *Attorney, Agent, or Firm*—Hudak, Shunk, & Farine Co. LPA

(57) ABSTRACT

The invention relates to a method for preventing contamination on the surfaces of optical elements comprising a multi-layer system, during the exposure thereof to radiation at signal wave lengths in an evacuated closed system comprising a residual gas atmosphere, whereby the photocurrent generated by means of photo emission from the radiated surface of the multi-layer system is measured. The photocurrent is used to regulate the gas composition of the residual gas. The gas composition is altered according to at least one lower and one upper threshold value of the photocurrent. The invention also relates to a device for regulating the contamination on the surface of at least one optical element during exposure and an EUV-lithographic device and a method for cleaning the surfaces of the optical elements contaminated by carbon.

21 Claims, 17 Drawing Sheets

U.S. PATENT DOCUMENTS

| | | |
|---|---|---|
| 6,004,180 A | 12/1999 | Knall et al. |
| 6,533,952 B1 * | 3/2003 | Klebanoff et al. ............. 134/1 |
| 6,545,272 B1 | 4/2003 | Kondo |
| 6,847,463 B1 * | 1/2005 | Malinowski ................ 356/630 |
| 2001/0026354 A1 | 10/2001 | Aoki |
| 2004/0211448 A1 * | 10/2004 | Klebanoff et al. ............ 134/39 |

* cited by examiner

DEVICE, EUV-LITHOGRAPHIC DEVICE AND METHOD FOR PREVENTING AND CLEANING CONTAMINATION ON OPTICAL ELEMENTS

FIELD OF THE INVENTION

The invention relates to a method for preventing contamination on the surfaces of optical elements in accordance with the claims.

The invention further relates to a device for controlling the contamination of the surface of at least one optical element and an EUV lithographic device with optical elements, in which a detection device for photoelectrons and secondary electrons is mounted in proximity of at least one of the optical elements and is operatively linked with an evaluation unit.

The invention further relates to a method for cleaning contaminated surfaces of optical elements by exposure to radiation in a vacuum containing a controlled amount of residual gas.

BACKGROUND OF THE INVENTION

Multilayer systems should be understood to include systems with special cover layer(s) (cap layer(s)).

Electric field intensity is defined here as the time-averaged square of the electric field strength, photocurrent as a photo-induced electric current occurring due to radiation, photoemission as the photo-induced release of electrons into the vacuum occurring due to radiation, photoelectrons as the photo-induced electrons released into the vacuum due to radiation, and secondary electrons as electrons retarded via secondary processes.

Optical elements, e.g., photomasks or multilayer mirrors, for the extreme ultraviolet wavelength range (EUV), particularly wavelengths of between 11 nm and 14 nm, are used in EUV lithography of semiconductor components. Typical EUV lithography devices have eight or more mirrors. To achieve, nevertheless, a sufficient total intensity of the working radiation, the mirror reflectivities must be as high as possible since the total intensity is proportional to the product of the reflectivities of the individual mirrors. To the extent possible, the mirrors should retain this high reflectivity over their entire life. Furthermore, the homogeneity across the mirror surfaces must be retained over the entire life of the mirrors.

The reflectivity and the life of EUV mirrors and EUV photomasks are affected particularly by the contamination of the surface under EUV radiation in the form of carbon deposits and by oxidation of the surface. Deposits are due, for example, to carbon-containing substances released in the form of gases from some of the device components or from the photoresist with which the wafers to be radiated are coated. Oxidation is caused by oxygen-containing molecules present in the residual gas atmosphere, which are split into radicals by the EUV radiation by means of photoemission. Photoelectrons emitted from the surface of the optical element lead to an accumulation of contamination because they split molecules of the residual gas adsorbed to the surface in a dynamic equilibrium into fragments, which are then permanently deposited on the surface or react therewith.

In the residual gas atmosphere, hydrogen, oxygen, nitrogen, water vapor, carbon monoxide and carbon dioxide typically dominate. As a rule, the partial pressures in mbar fall within the following ranges:

| | Typical range for ultra-high vacuum systems [mbar] | Typical baked vacuum [mbar] | Typical non-baked vacuum [mbar] |
|---|---|---|---|
| $C_xH_y$ | $10^{-12}$–$10^{-8}$ | $10^{-12}$ | $10^{-8}$ |
| CO | $10^{-12}$–$10^{-8}$ | $10^{-12}$ | $10^{-9}$ |
| $CO_2$ | $10^{-12}$–$10^{-8}$ | $10^{-12}$ | $10^{-9}$ |
| $H_2$ | $10^{-10}$–$10^{-7}$ | $10^{-11}$ | $10^{-8}$ |
| $H_2O$ | $10^{-10}$–$10^{-6}$ | $10^{-11}$ | $10^{-7}$ |
| $N_2$ | $10^{-10}$–$10^{-7}$ | $10^{-11}$ | $10^{-7}$ |
| $O_2$ | $10^{-10}$–$10^{-7}$ | $10^{-11}$ | $10^{-8}$ |

Depending on the partial pressure conditions and the incident EUV intensity, either the process of surface oxidation or the process of the deposition of carbon on the surface predominates. Thus, one speaks either of an oxidizing or a carbonizing environment.

German Laid Open Publication DE 41 06 841 A1 discloses a method for determining contamination by means of photoemission, in which photoelectrons are released by sequentially illuminating a surface and are detected with an electron collection device. The photoelectric current can be used to deduce the thickness of the contaminant layer. To compensate the effects of capacitive current, a second electron collection device is provided, which is adjacent to the first electron collection device and spaced at the same distance from the surface. The currents detected by the electron collection devices are subtracted from one another. Furthermore, means are provided to compensate the effects of photovoltaic current.

U.S. Pat. No. 6,004,180 is concerned with the cleaning of electron-emitting components forming the cathode of the cathode ray tube. Introducing a gas, e.g. oxygen, causes the deposits on the cathode to be converted into gaseous products. The document does not describe a specific control of the gas intake.

From the Japanese publication JP 62051224 A it is known to track the cleaning with UV-light-supported oxidation by measuring photoelectrons. Surfaces contaminated with carbon-containing substances are exposed to UV light in an oxygen-containing atmosphere. Under the UV influence, ozone forms, which in turn is split into oxygen radicals, which etch the carbon contaminants off the surface to be cleaned. The UV light furthermore excites the emission of secondary electrons. Their number increases with decreasing thickness of the contaminant layer. The intensity of the photoemission is signaled. This signal, however, is not used to control a cleaning process.

European Publication EP 0 987 601 A2 discloses a method and a device for measuring the degree of contamination of optical elements within a soft X-ray lithographic system. For this purpose, the photoelectrons emitted from the potentially contaminated surface are measured. This signal is evaluated online. It is translated into a contamination level by comparing it with empirical data. If a specific contamination level is reached, the corresponding optical element must be replaced.

SUMMARY OF THE INVENTION

The object of the invention is to provide a method and a device with which the contamination of the surface of an optical element exposed to EUV radiation can be prevented before it makes the optical element completely unusable. A further object of the invention is to provide a method for cleaning a contaminated surface.

This object is attained by a method in which the photocurrent is used to regulate the composition of the residual gas, such that the composition of the residual gas is altered according to at least one lower and one upper threshold value of the photocurrent.

With a residual gas analysis using a residual gas analyzer (e.g. a mass spectrometer) it is possible, in addition, to determine experimentally (calibration) whether the environment is a carbonizing or oxidizing environment, which in turn determines the nature and the degree of the contamination. In this analysis, the incident EUV intensity and the spectrum of the incident radiation must be taken into account.

It has been found that the relationship between the photocurrent and the contamination of the surface of optical elements can be used to actively control and reduce the contamination on optical elements.

By adding or reducing the addition of corresponding gases to the closed system in which the optical elements are located, it is possible to convert an oxidizing atmosphere into a carbonizing atmosphere and vice versa.

The residual gas components (e.g., hydrocarbons), which are adsorbed from the residual gas atmosphere to any surfaces, are split by the photoelectrons in the area of the EUV radiated surfaces, such that a carbon layer is deposited on the surface of optical elements, which causes a change in the photocurrent. A process competing therewith is the oxidation of the carbon to CO and $CO_2$, whereby the carbon layer can be removed again, which causes an opposite change in the photocurrent.

If the change in the radiated surface is not only observed but the residual atmosphere is altered to immediately influence the further change in the contamination level of the surface, the contamination rate and the reduction of the contaminant layer can be controlled in a simple manner.

The first threshold value $S_1$ is obtained at the start of radiation after transient effects have subsided and is characteristic for the initial actual state of the radiated surface. In contrast, the one or more second threshold values $S_{2,i}$ are predetermined. They not only depend on the structure of the reflective layer system, i.e., its material and its thickness structure, but also strongly depend on the initial composition of the residual gas atmosphere and the EUV intensity. The subsidence of transient effects should be understood, in particular, as the desorption of the water layer typically present on the surface of the optical element, which causes a high photocurrent at the start of radiation, which correspondingly decreases with the decrease in the water layer. This process continues for a few minutes. A period of up to 20 min, preferably up to 5 min is required until the photocurrent has stabilized.

The one or more second threshold values $S_{2,i}$ must first be obtained from calibration measurements. The requirements of the radiation application must also be taken into account, such as, for example, the fact that in lithography the contamination and thus the reflectivity should be fluctuating only within certain limits.

The thresholds $S_1$ and $S_{2,i}$ are preferably determined from the photocurrent of a clean non-oxidized surface under operating conditions, i.e., after the subsidence of transient effects. $S_1$ corresponds to the photocurrent of the clean surface and $S_{2,i}$ to the photocurrent of a desired carbon thickness.

In the evaluation of the photoemission measurement, the decay of the corresponding current signal, which is exponential over time, may play a role if the time constant of the decay is less than the period T of the radiation source. Synchrotron radiation has pulse frequencies in the upper megahertz range, so that a constant current can be measured because of the time lag of the photocurrent measurement. Pulsed lasers, in contrast, have frequencies in the lower kilohertz range, so that, with the time constant of the photoemission process, a saw-tooth current can be measured. To avoid the influence of the period of the radiation source, the photoemission signal is preferably converted into the mean time integral $\bar{I}$ of the corresponding photocurrent.

$$\bar{I}\,\text{current} = \int_{T_1}^{T_2} \frac{I\,\text{current}(t)\,dt}{T_2 - T_1} \quad \begin{array}{l}\text{where } T_2 - T_1 \gg T \\ T: \text{Period}\end{array}$$

It is furthermore advantageous if the time-averaged current integral is normalized to the incident radiation intensity for each individual radiated optical area:

$$\bar{I}\,\text{norm} = \bar{I}\,\text{current}/\bar{I}\,\text{radiation where } \bar{I}\,\text{radiation} = \int_{T_1}^{T_2} \frac{I\,\text{radiation}(t)\,dt}{T_2 - T_1}$$

where $T_2 - T_1 \gg T$

T: period i=1, 2, . . . , n. n: number of radiated optical areas.

$\bar{I}_{norm}$ is primarily meant whenever photocurrent is discussed.

In a carbonizing environment, the photocurrent is preferably used to regulate the partial oxygen pressure or the partial pressure of the oxygen-containing gas.

In an oxidizing environment, the photocurrent is preferably used to regulate the partial pressure of the hydrocarbon-containing gas.

Preferably, the threshold values of the photocurrent are selected from the range between the minimum photocurrent $I_{min}$ and the maximum photocurrent $I_{max}$. They occur when the minimum and the maximum of the electric field intensity of the standing wave, which forms in the multilayer system when the incident signal wavelength is reflected, lie in the free interface of the multilayer system. Care must be taken that the free interface of the multilayer system moves only in the area of either the trailing edge or the rising edge of the standing wave of the electric field intensity. If the free interface were to pass through the extreme values of the standing wave during radiation, no meaningful control of the residual gas composition could be ensured. Whether the free interface is in the trailing edge or the rising edge at the start of radiation is determined by the design of the multilayer system. In a multilayer system with a Ru cap layer the design is preferably selected in such a way that the free interface of the cap layer is in the trailing edge of the standing wave of the electric field intensity during the growth of the carbon.

According to one preferred embodiment of the method the following steps are executed:

a) Measuring a first value of the photocurrent at the start of the EUV radiation after the subsidence of the transient effects and storing this value as a first threshold value $S_1$, b) Defining at least one second threshold value $S_{2,i}$ for the photocurrent where i=1, 2, 3, . . . , such that $S_1 > S_{2,i}$, or $S_1 < S_{2,i}$, c) Measuring the photocurrent during the ongoing EUV radiation,
d) Controlling the gas composition during radiation as a function of the measured photocurrent by supplying at least one gas to the closed system before or when the second threshold value $S_{2,i}$ is reached or exceeded and subsequently at least restricting the supply of the gas, before or when the first threshold value $S_1$ is reached or exceeded.

In this case the supplied gas is preferably an oxidizing gas. If $S_1 > S_{2,i}$ is selected the free interface is in the trailing edge of the standing wave of the electric field intensity. If $S_1 < S_{2,i}$ is selected the free interface is in the rising edge.

According to another preferred embodiment of the method the following steps are executed:
a) Measuring a first value of the photocurrent at the start of the EUV radiation after the subsidence of the transient effects and storing this value as a first threshold value $S_1$,
b) Defining at least one second threshold value $S_{2,i}$ for the photocurrent where i=1, 2, 3, . . . , such that $S_1 > S_{2,i}$, or $S_1 < S_{2,i}$,
c) Measuring the photocurrent during the ongoing EUV radiation,
d) Controlling the gas composition during radiation as a function of the measured photocurrent by supplying at least one gas to the closed system before or when the first threshold value $S_1$ is reached or exceeded and subsequently at least restricting the supply of the gas before or when the second threshold value $S_{2,1}$ is reached or exceeded.

In this case, the supplied gas is preferably a carbonizing gas. If $S_1 > S_{2,i}$ is selected, the free interface is in the trailing edge of the standing wave of the electric filed intensity. If $S_1 < S_{2,i}$ is selected, the free interface is in the rising edge.

The two above-described variants of the method may also be combined, such that the corresponding gases are alternately supplied and restricted according to the threshold values.

These methods can result in a decaying photocurrent curve or an oscillating photocurrent curve, which will be described below.

The type and amount of gas being supplied in a controlled manner depend on the one hand on the residual gas composition and on the other hand on the nature and extent of the existing contamination and, furthermore, on the measured photoemission signal.

This gas can be a gas that is already contained in the residual gas atmosphere but not in a sufficient amount to achieve the desired effect. The possible effects are either the prevention of oxidation or the defined adjustment of the desired carbon coating.

The ratio of the residual gas components can be changed by adding carbon monoxide, carbon dioxide, hydrogen, water, oxygen or nitrogen.

It is also possible, however, to add a gas that has not previously been present in the residual gas atmosphere.

Adding an inert gas, such as SF6, He, Ne, Ar, Kr or Xe is preferred. Such gases influence the effectiveness or the reaction rate of carbonizing or oxidizing gases.

To convert an oxidizing residual gas environment into a carbonizing residual gas environment, the addition of hydrocarbons is provided, preferably, alkanes, alkenes, alkines, alcohols, ketones, aldehydes and other hydrocarbons.

To fine adjust the equilibrium for the borderline case between carbonizing and oxidizing environment, the addition of an oxygen-containing gas is provided, preferably formic acid, acetic acid, propionic acid, hydrogen peroxide, hydrazine, $N_2O$, NO, $NO_2$, $SO_2$ and other oxygen-containing gases.

To reduce a strong carbon coating aggressively, the short-term use of halogen and hydrogen-containing compounds is provided, preferably F, Cl, Br, I, chloromethane, dichloromethane, trichloromethane, carbon tetrachloride, carbon tetrafluoride, fluoromethane, difluoromethane, ammonia, phosphine, antimony hydride, hydrogen fluoride, hydrogen chloride, hydrogen bromide, hydrogen iodide, boron fluoride, diborane, nitrogen trifluoride, hydrogen sulfide, hydrogen selenide, hydrogen telluride and other halogen/hydrogen-containing gases, or a combination of two or more of these gases.

The supply of the gases can be continuously variable. For example, the valves of the gas feed can be continuously open and, when the photocurrent approaches a threshold value, can also be continuously closed again.

To support the process, the partial pressures of the above gases are regulated via the photocurrent. The photocurrent is preferably used to regulate the partial pressure of the oxygen-containing gases.

When the composition of the residual gas atmosphere is modified by altering the partial oxygen pressure, either the oxidation process or the carbon deposition process is favored. The partial oxygen pressure is changed by adding either oxygen or oxygen-containing gases. By increasing the partial oxygen pressure, the equilibrium is altered toward oxidation, which reduces the carbon-containing deposits. Since the number of emitted secondary electrons is highly susceptible to the shifting of the free interfaces, the method according to the invention makes it possible to react to contaminant layers even in the angstrom to nanometer range and to minimize contamination efficiently during radiation.

The partial oxygen pressure is preferably regulated in the range of $10^{-12}$ to $10^2$ mbar, particularly preferably in the range of $10^{-9}$ to $10^3$ mbar, especially in the range of $10^{-8}$ to $10^{-5}$ bar.

In the simplest case, the threshold values are maximum values of the photocurrent, which correspond to a degree of oxidation that is only just tolerable. If a maximum value is exceeded, the residual gas composition must be altered such that any further oxidation is immediately inhibited.

Minimum values of the photocurrent, which correspond to a carbon coating that is only just tolerable, are another example of threshold values. If a minimum value is not reached, the residual gas composition must be altered such that any further carbon deposits are immediately inhibited.

However, intermediate values are also feasible as appropriate threshold values, which are obtained if one takes into account the initial characteristic of the electric field intensity at the free interface. It is also meaningful to convert the time shape of the photocurrent curve into its mathematical first and higher derivatives. According to the desired operating conditions, threshold values can then also be introduced relative to these derivatives of the photocurrent curve.

This is appropriate especially if the gas supply is to be turned on or off directly before a maximum or minimum of the photoemission intensity because the corresponding change in the slope can be determined more precisely than the approaching passing through an extreme value. This makes it possible, for example, to effectively prevent the unwanted oxidation of the mirror surface itself, i.e. after the carbon contaminants have been removed.

It is also feasible to monitor the second or higher derivative or another function of the intensity of the photoelectrons, e.g., integration.

To achieve a convergence to a state of equilibrium in which particularly the effects of oxidation and deposits of carbon-containing substances are cancelled out, i.e., the level of contamination remains constant at the lowest possible value, it has proven to be advantageous to allow the second threshold value $S_{2,i}$ to approach the first threshold value $S_1$.

Preferably, several second threshold values $S_{2,i}$ are defined, such that $|S_{2,i+1}-S_1| \leq |S_{2,i}-S_1|$ or $|S_{2,i+1}-S_{2,i}| \leq |S_{2,i}-S_{2,i-1}|$ where $i=1,2,3,\ldots$ The method can be further improved if prior to EUV radiation the position of the closest minimum and/or reversal point and/or maximum (curve position) of the electric field intensity of the standing wave forming in the multilayer system when the incident signal wavelengths are reflected is determined in relation to the free interface of the multilayer system and, as a function thereof, the second threshold value $S_{2,i}$ is correspondingly determined as a lower or upper threshold value in relation to the first threshold value $S_1$.

It has been found that there is an interrelationship between the electric field intensity of the standing wave—which depending on the multilayer design is established at the free interface of the optical element—and the contamination of this free interface. It has also been found that if the electric field intensity of the standing wave established at the free interface is minimal, the emission of the photoelectrons from the interface is likewise minimal. On the other hand, if the electric field intensity at the free interface is maximal, then the photocurrent is also maximal.

If there is little or no photoemission, the splitting of the residual gas molecules, which are deposited on the surface from the residual gas in a dynamic equilibrium, e.g., hydrocarbon or water molecules, and which could otherwise contaminate the free interface, is largely inhibited. In an oxygen-containing residual gas atmosphere, the dynamic equilibrium can be shifted by means of the photocurrent control loop in such a way that, despite the photoemission, neither oxidation nor an accumulation of carbon occurs.

The curve position of the non-contaminated multilayer system determines the initial shape of the photocurrent curve during operation, i.e., during contamination of the surface of the optical element. On the one hand, the growth of a carbon layer causes a change in the curve position. On the other, the deposition of the carbon material causes the photoconversion efficiency to decline. The superposition of the two effects leads to a more or less strong increase or decrease in the photocurrent.

The second threshold values $S_{2,i}$ should be correspondingly selected as the lower or upper threshold values.

Preferably, the upper threshold value $S_{2,i}$ is selected to be less than or equal to the maximum photocurrent $\bar{I}_{max}$ at which the free interface is at the maximum of the electric field intensity of the standing wave.

The lower threshold value $S_{2,i}$ is preferably selected to be greater than or equal to the minimum photocurrent $\bar{I}_{min}$ at which the free interface is at the minimum of the electric field intensity of the standing wave. Preferably, the threshold values $S_{2,i}$ are adjusted to 80%–10% of the range $\bar{I}_{max}-\bar{I}_{min}$, particularly preferably to 50%–20%.

With surfaces that are susceptible to oxidation, an oxidation of the surface—which is unavoidable in an oxidizing environment—must be prevented. Thus, prior to the EUV radiation, a carbonizing gas composition that leads carbon deposits is adjusted. These carbon deposits, however, can be reduced again because of the controlled residual gas adjustment (e.g. by adding at least one oxygen-containing gas). It is also possible to return to a carbonizing environment each time before reaching the first threshold value $S_1$ (e.g. by adding at least one carbon-containing gas).

To obtain a rapid response on the radiated surface to the changing residual gas composition, the gas is preferably delivered as close as possible to the surface, i.e., in proximity to the optical element.

The object of the invention is further attained by a device for controlling the contamination on the surface of at least one optical element, comprising a detection unit for the photoelectrons emitted by the optical element, an evaluation unit connected to the detection unit, and a control unit connected to the evaluation unit and to a gas delivery unit. The evaluation unit is configured to compare the measured photocurrent with at least two stored threshold values of the photocurrent and to emit threshold-dependent signals to the control unit.

An inventive EUV lithographic device with optical elements, in which a detection unit for photoelectrons is mounted in the proximity of at least one of the optical elements which is operatively linked with an evaluation unit, is characterized in that a control unit is connected to the evaluation unit and operatively linked to at least one gas delivery unit, such that the evaluation unit is configured to compare the measured photocurrent with at least two stored threshold values of the photocurrent and to emit threshold-dependent signals to the control unit.

The device according to the invention or its embodiment as a EUV lithographic device is suitable to carry out the method according to the invention. The detection unit is used to measure the photoemission. These data, preferably their characteristic as a function of time, (or their derivatives, integrals or other suitable functions) are converted in the evaluation unit and are compared with the threshold values. The resulting information is forwarded to the control unit, which then controls the gas delivery unit.

The detection unit preferably comprises a detection ring or detection network disposed above the surface of the optical element and arranged and/or configured in such a way that it does not affect or only negligibly affects the incident EUV radiation. However, the photocurrent can also be discharged via any metal surface located in the vicinity. This can be a plate or even the wall of the vacuum chamber.

The open diameter of the detection unit can, for instance, be selected large enough that the EUV radiation can pass unhindered while the photoelectrons can still be measured reliably.

The gas delivery unit has preferably at least one gas feed, which is advantageously arranged adjacent to the surface of the optical element. An adjacent arrangement clearly reduces the response time until the supplied gas is effective.

In preferred embodiments, the device and the EUV lithographic device have a mass spectrometer, which also forwards its signals to the evaluation unit. This mass spectrometer is used to measure the residual gas composition before or at the start of the radiation or to measure the gas composition and its partial pressures during the radiation in parallel to the photoemission measurement.

Furthermore, at least one measuring device for the total pressure is provided.

The evaluation unit and the control unit are advantageously combined into a closed-loop control unit, which can be configured as an analog or digital circuit or an integrated circuit. It can also be a computer equipped with corresponding data acquisition and control cards.

Moreover, to normalize the photocurrent, one or more devices for measuring the EUV intensity are preferably provided (e.g., at each mirror).

The object of the invention is further attained by a method for cleaning carbon-contaminated surfaces of optical elements by EUV radiation. This method is characterized by measuring the photocurrent generated during the radiation of the surface to be cleaned and by selecting the point when the photocurrent exceeds or falls below predefined threshold values as the point when the gas supply is stopped. These threshold values are the above-described threshold values $S_1$, $S_{2,i}$.

For surfaces that are already heavily contaminated with carbon, the cleaning is preferably carried out under EUV radiation in an oxygen-containing atmosphere to remove the contamination. To stop the cleaning process in time before the surface itself is attacked, i.e., to prevent a so-called over-etching, the photoelectrons emitted during the cleaning process are detected.

BRIEF DESCRIPTION OF THE DRAWINGS

The invention will now be described in greater detail with reference to the drawings, in which.

DETAILED DESCRIPTION OF THE INVENTION

Figure 1:
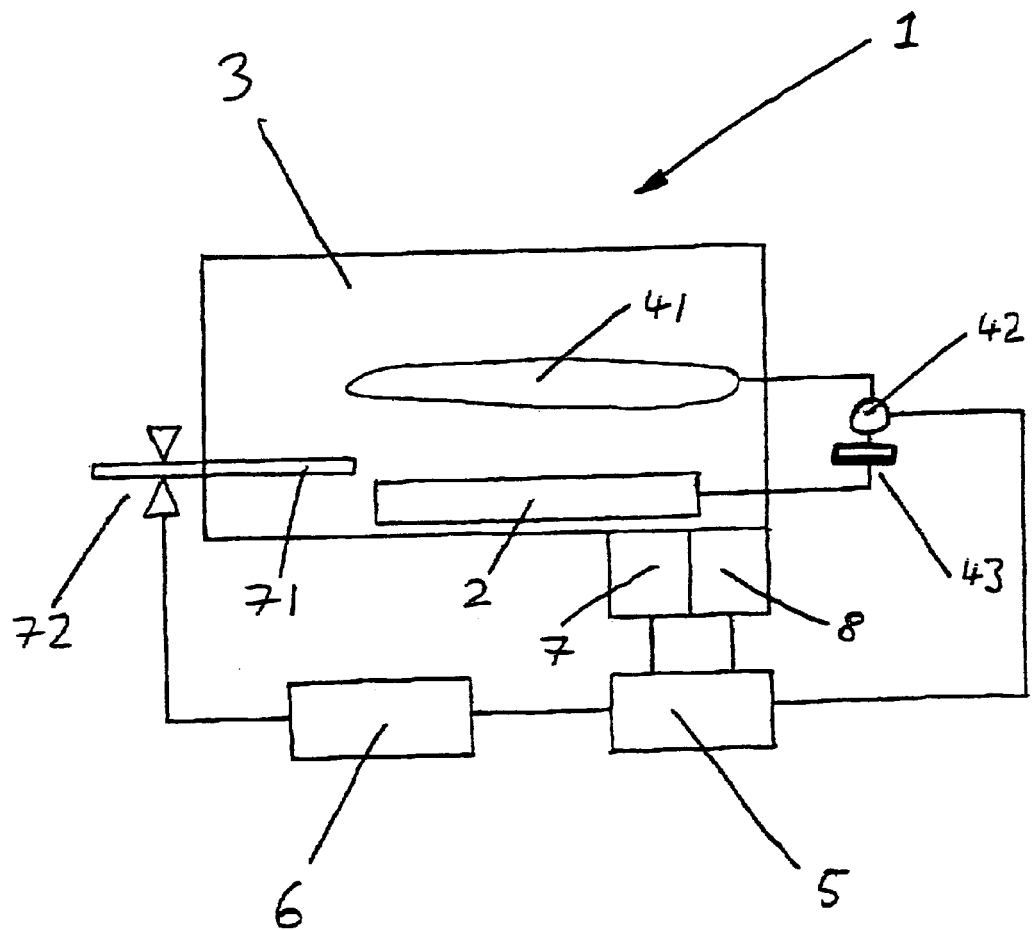
FIG. 1 schematically shows the structure of a device according to the invention, FIGS. 2a–d schematically illustrate an optical element and the associated electric field intensity.

The device 1 has a vacuum chamber 3 in which an optical element 2, e.g., a mirror with a multilayer system or an optical mask, is arranged, which is illuminated with EUV radiation. Above the optical element 2, a detection ring or detection grid 41 is arranged, which is substantially transparent for the EUV radiation. To cause the photoelectrons to be attracted by the ring 41, a voltage of a few volts (0 to 100 V) is applied by a voltage source 43 between the optical element 2 and, the ring 41. When a photoelectron strikes the ring 41, a current flows, which is measured with the aid of the ammeter 42. In the evaluation unit 5, configured, for example, as an analog or digital circuit or as an integrated circuit, or which can be combined with the control unit 6 into a closed-loop control unit, e.g., in the form of a computer, the current signal is evaluated, e.g., by integrating it over time and comparing it with predetermined and stored threshold values. The information as to which threshold value is exceeded or fallen short of at a given time is forwarded to the control unit 6, which then opens or closes the valve 72 of the gas feed 71. The gas feed 71 discharges in immediate proximity to the surface of the optical element 2 so that the equilibrium between the carbon deposition and the oxidation process can be altered with the least possible delay.

Before the start of radiation, the initial partial pressure of the residual gas components is measured with a mass spectrometer or residual gas analyzer 8 and forwarded to the evaluation unit 5. This data is used to select the appropriate set of threshold values. During radiation, the entire residual gas spectrum continues to be measured with the mass spectrometer 8 in parallel to the photocurrent. This additional information makes it possible, among other things, to check whether the analysis is still based on the appropriate set of threshold values.

With a correspondingly extensive calibration and possibly taking into account the current partial residual gas pressures, the control of the gas supply can be refined such that the valve 72 is not only opened and closed but intermediate positions are also adjusted. Continuously variable valves are preferably used for this purpose. For a homogenous distribution of the one or more gases being supplied, a plurality of gas feeds 71 should be arranged around the area. In this case, it is also possible to control which of the gas feeds is progressively opened. In addition, a device 7 for measuring the EUV intensity is connected to the evaluation unit 5.

Multiple units of some or all of the described components may be present in the vacuum chamber 3.

FIGS. 2a–d show an optical element that has a multilayer system 10 on a substrate 11. The electric field intensity I is also shown for different cases 1, 2, 3, 4.

In case 1, the free interface 100 of the multilayer system 10 lies between a reversal point and the positive slope of the electric field intensity rising from the multilayer system.

In case 2, the free interface 100 of the multilayer system 10 lies between a relative maximum and the reversal point on the negative slope of the electric field intensity falling from the multilayer system.

In case 3, the free interface 100 of the multilayer system 10 lies between a reversal point and the negative slope of the electric field intensity falling from the multilayer system.

In case 4 the free interface 100 of the multilayer system 10 lies between a relative minimum and the reversal point on the positive slope of the electric field intensity rising from the multilayer system.

20 identifies the carbon layer growing through contamination whose free interface is identified by the reference numeral 101.

FIG. 2a–d clearly illustrate how the growth of the carbon layer 20 causes the curve position of the electric field intensity to change in relation to the free interface 101.

The following FIGS. 3–14 show the photocurrent for different multilayer systems for initially uncontaminated, free interfaces 100 in the cases 1, 2, 3 and 4.

In a first approximation, the time characteristic of the photocurrent corresponds to the time characteristic of the electric field intensity at the free interface. Taking into account the emission depth of photoelectrons in a further approximation leads to the addition of a constant background of the photocurrent characteristic. Higher approximations are possible.

The photocurrent curves of FIGS. 3 to 6 represent the cases 1 to 4 on a multilayer system with a ruthenium surface layer that is not susceptible to oxidation. The multilayer system can, for example, have the following layer structure:

Ru(1 nm)/Mo(1 nm)/Si(1.9 nm)/Mo(2.85 nm)/37×[Si (4.1 nm)/Mo(2.85 nm)]/substrate

Figure 2A:
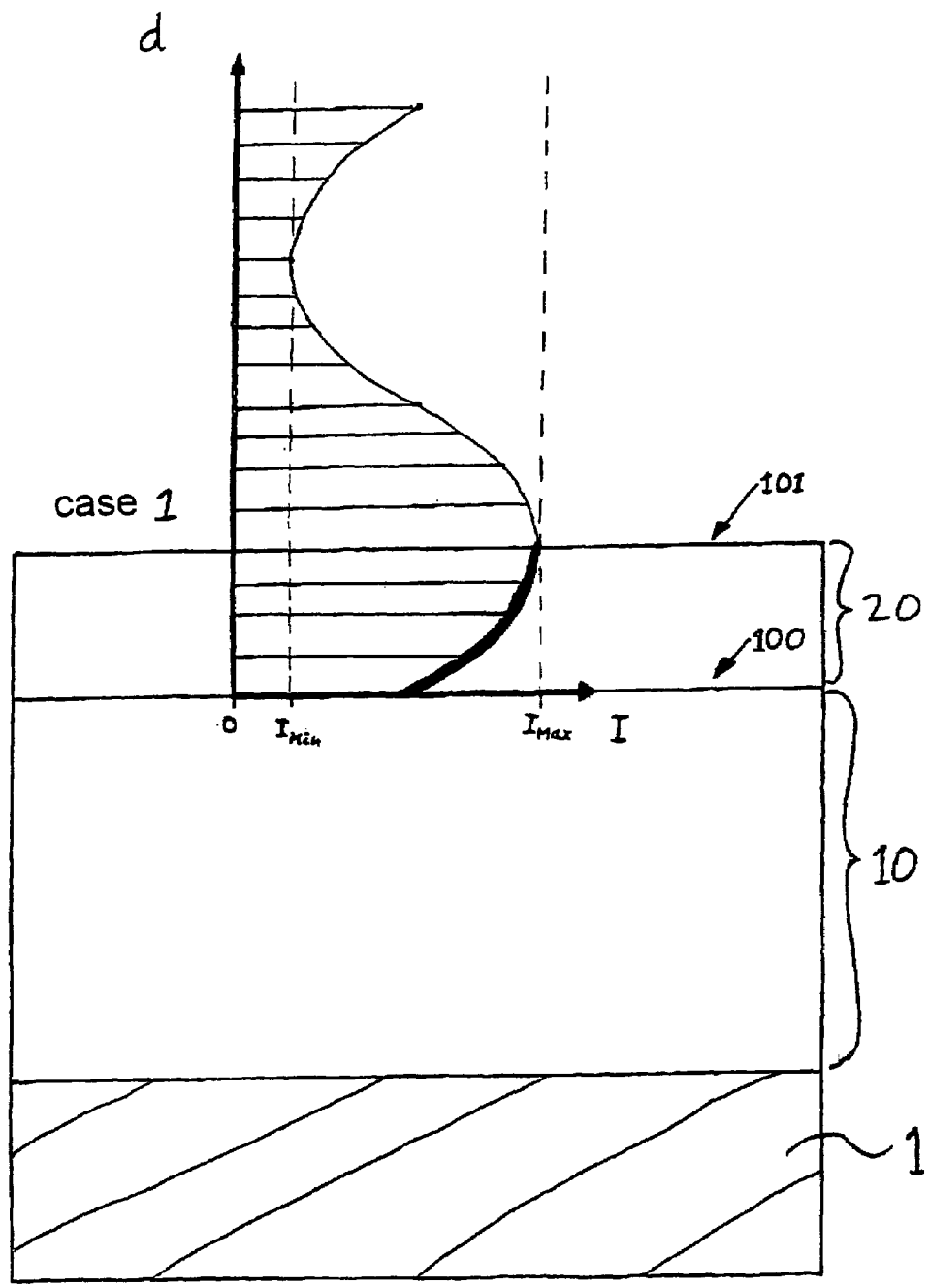
Figure 2B:
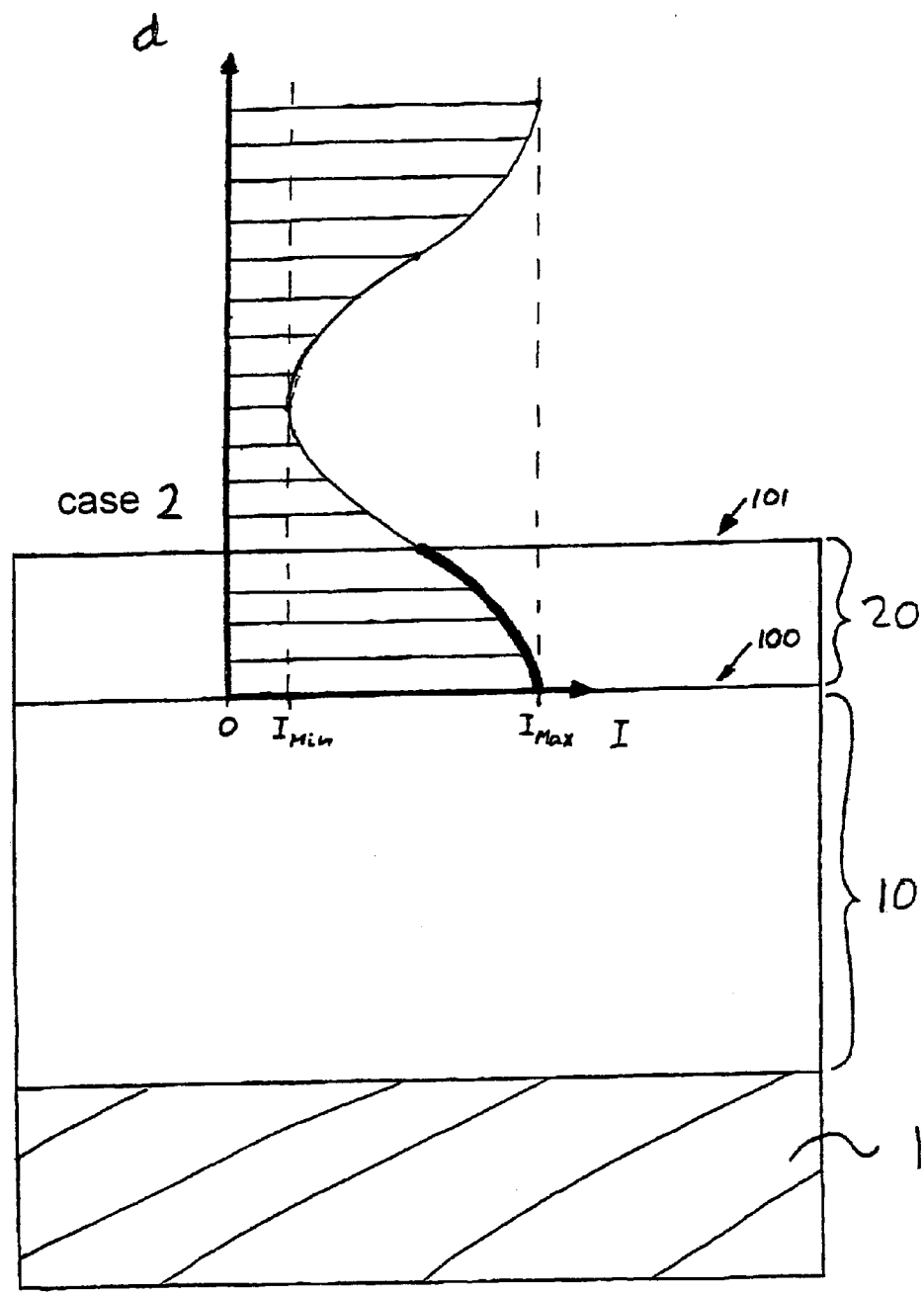
Figure 2C:
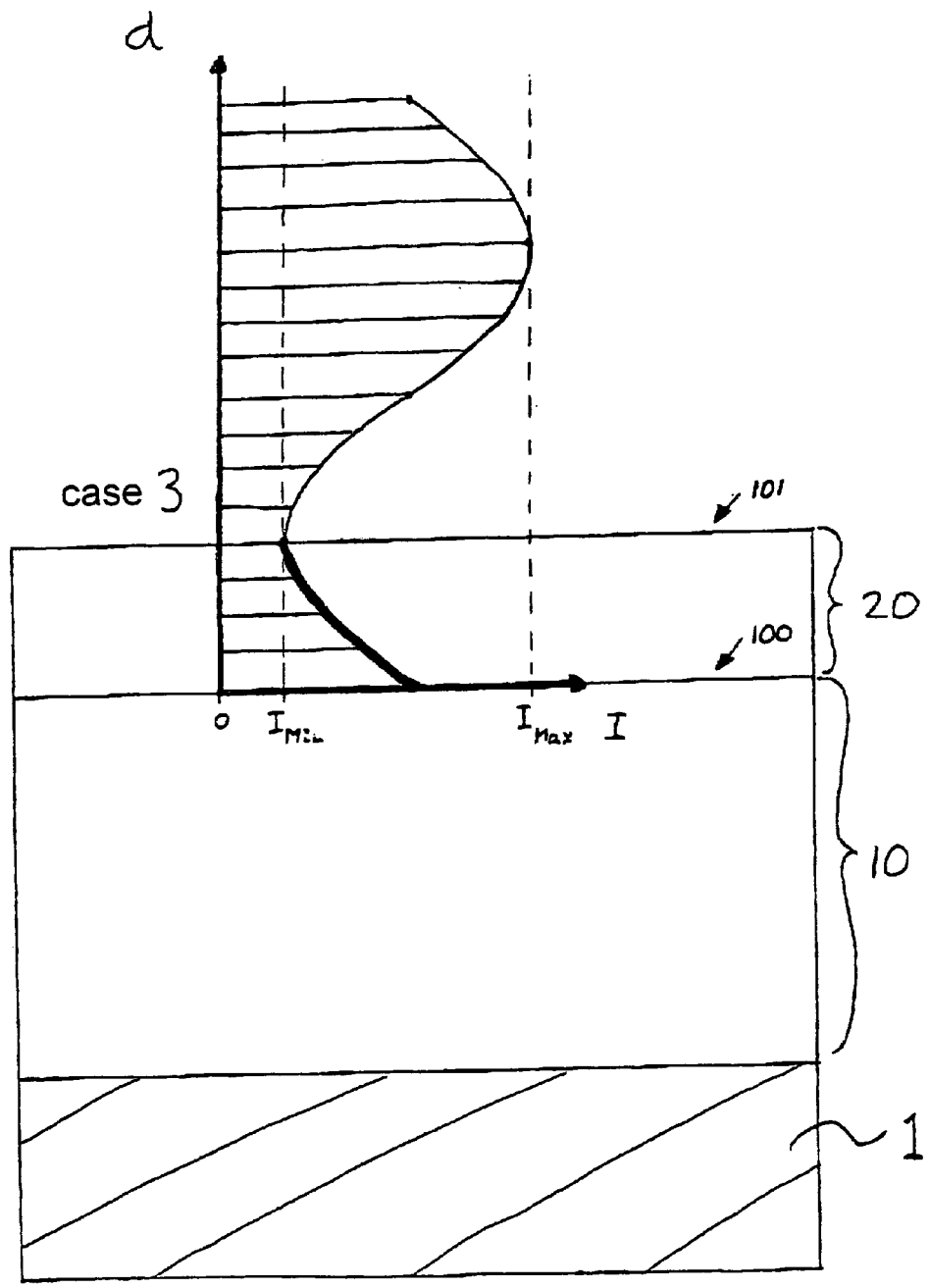
Figure 2D:
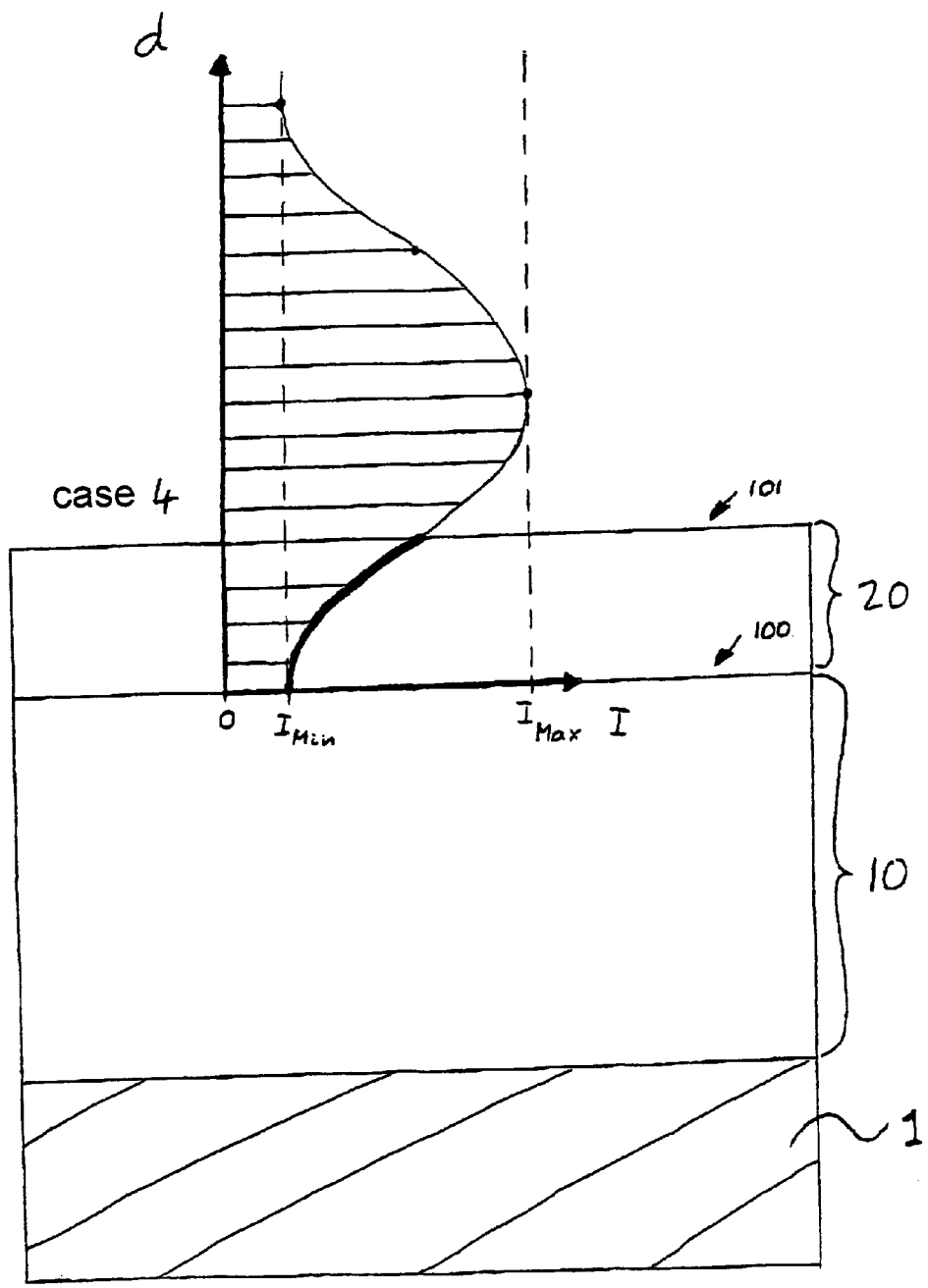
Figure 3:
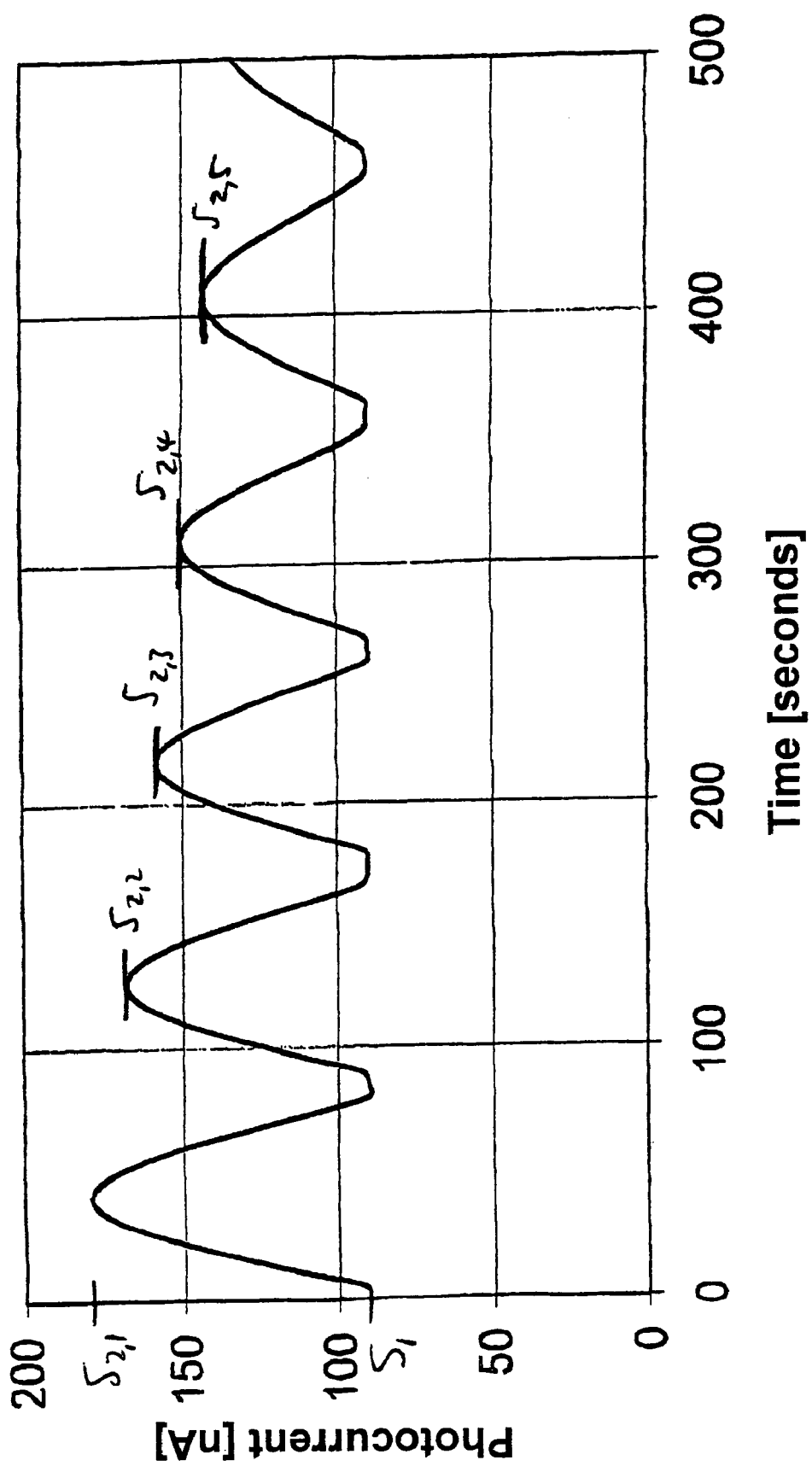
FIGS. 3–6 are controlled photocurrent curves for an optical element with an oxidation-resistant surface for four different curve positions of the electric field intensity.

FIG. 3 relates to case 1 illustrated in FIG. 2a.

In case 1, the free interface 100 is located at a reversal point of the electric field intensity, which means that the photocurrent has a mean value $S_1$. With increasing carbon growth, the curve of the electric field intensity rises, which is accompanied by an increase in the photocurrent. The growth of the carbon material causes the number of the photoelectrons to decrease. However, the increase in the photoelectrons as a result of the growth of the free interface toward the maximum of the electric field intensity at which the photoemission is greatest dominates.

Since the position of the free interface with respect to the photoemission represents the dominant parameter compared to the material properties, the photocurrent curve increases overall until the second threshold value $S_{2,i}$ is reached. Through an appropriate supply of oxygen, this curve swings back to the threshold value $S_1$ (see FIG. 3). The oxygen supply is reduced and finally shut off completely, which in turn causes the carbon to grow. When the second threshold value $S_{2,2}$, which is smaller than $S_{2,1}$ is reached, oxygen is again introduced, etc.

In case 3, the free interface 100 is also at a reversal point to start with, but the free interface 101, as a result of the carbon growth, moves toward the wave node, i.e. toward the minimum of the electric field intensity, which is connected with a decrease in the photocurrent. This decrease is intensified by the decrease in the photoemission caused by the carbon material, which results in the curve shown in FIG. 5.

In case 4 (see FIG. 6), the wave node or the minimum of the electric field intensity is located directly on the surface, which means that the photocurrent is low. If the carbon layer grows, the photocurrent increases because the surface migrates out of the node position. Although the growth of the carbon material causes a reduction in the photoconversion efficiency, the increase in the photocurrent due to the growth out of the node position dominates. This results in an increasing photocurrent curve. When the threshold value $S_{2,i}$ is reached, oxygen or an oxygen-containing gas is introduced into the closed system, which causes oxidation and thus a reduction in the carbon layer. As a result, the photocurrent curve decreases because the free interface approaches the node position due to the reduced carbon layer thickness. When the initial state of a carbon free surface is reached, which corresponds to the lower threshold value $S_1$, no further oxidation should take place and the oxygen supply is correspondingly reduced. This process is repeated, such that the second threshold values $S_{2,2}$, $S_{2,3}$, $S_{2,4}$, $S_{2,5}$ are each placed lower than the preceding second threshold values, such that overtime, there is an approach toward the threshold value $S_1$, so that the control range can be minimized.

Figure 4:
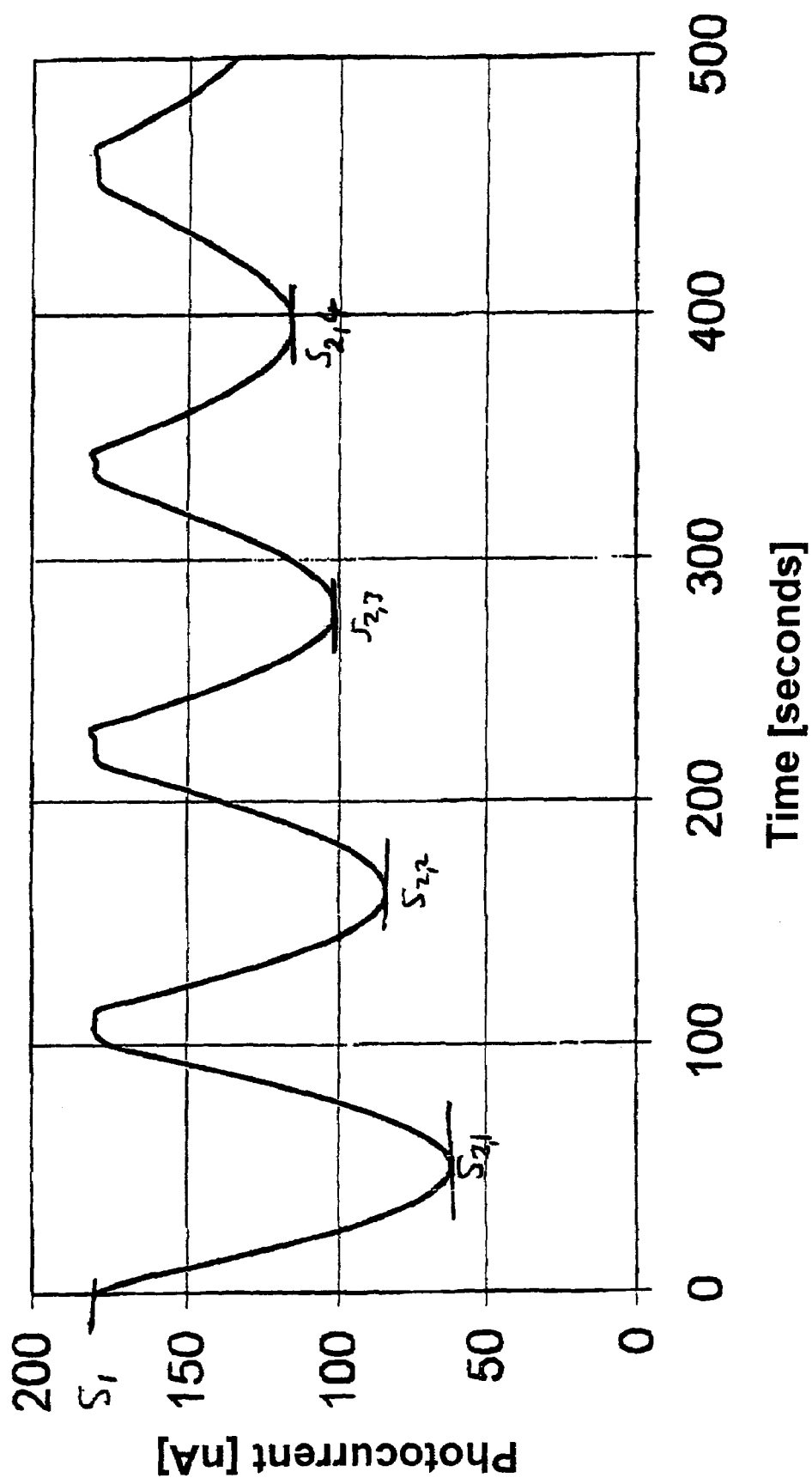

In case 2, the free interface 100 of the multilayer system is at the maximum of the curve of the electric field intensity of the standing wave. In this case, the photoemission is clearly higher than in case 4 based on the curve position. In FIG. 4, the first threshold value $S_1$ is at approximately 180 nA. Due to the growth of the carbon layer, the surface migrates out of this position. This is connected with a decrease in the photocurrent. The growth of the carbon layer is also expressed in a reduction of the photoemission, which in the aggregate leads to a strong decrease in the photoemission curve. The curve continues to decrease until the limit $S_{2,1}$ is reached. Before or when this limit is reached or exceeded, the appropriate oxygen supply is started, which causes the carbon layer to be reduced. As a result, the photocurrent curve swings back to the starting value $S_1$. This process also continues periodically and the second threshold values $S_{2,2}$, $S_{2,3}$, etc. are each set higher, so that over time, the threshold values approach the first threshold value $S_1$.

The curve of the photocurrents depends decisively on whether one is at a point with a large or a small initial slope with respect to the electric field intensities. In cases 1 and 3 one is at a large initial slope with respect to the electric field intensity of the standing wave, which causes a more rapid feedback and thus a large oscillation frequency. The carbon material, however, causes a general reduction in the photocurrent because of its low photoconversion efficiency. In the cases 2 and 4 one is at a small initial slope, so that the feedback of the closed-loop control circuit is slower.

FIG. 7 to 10 show the photocurrent curves for an optical element with a carbon cap layer susceptible to oxidation (e.g., a 1 nm C cap layer). The four curves also relate to the cases 1 to 4 shown in FIGS. 2a–d.

Figure 7:
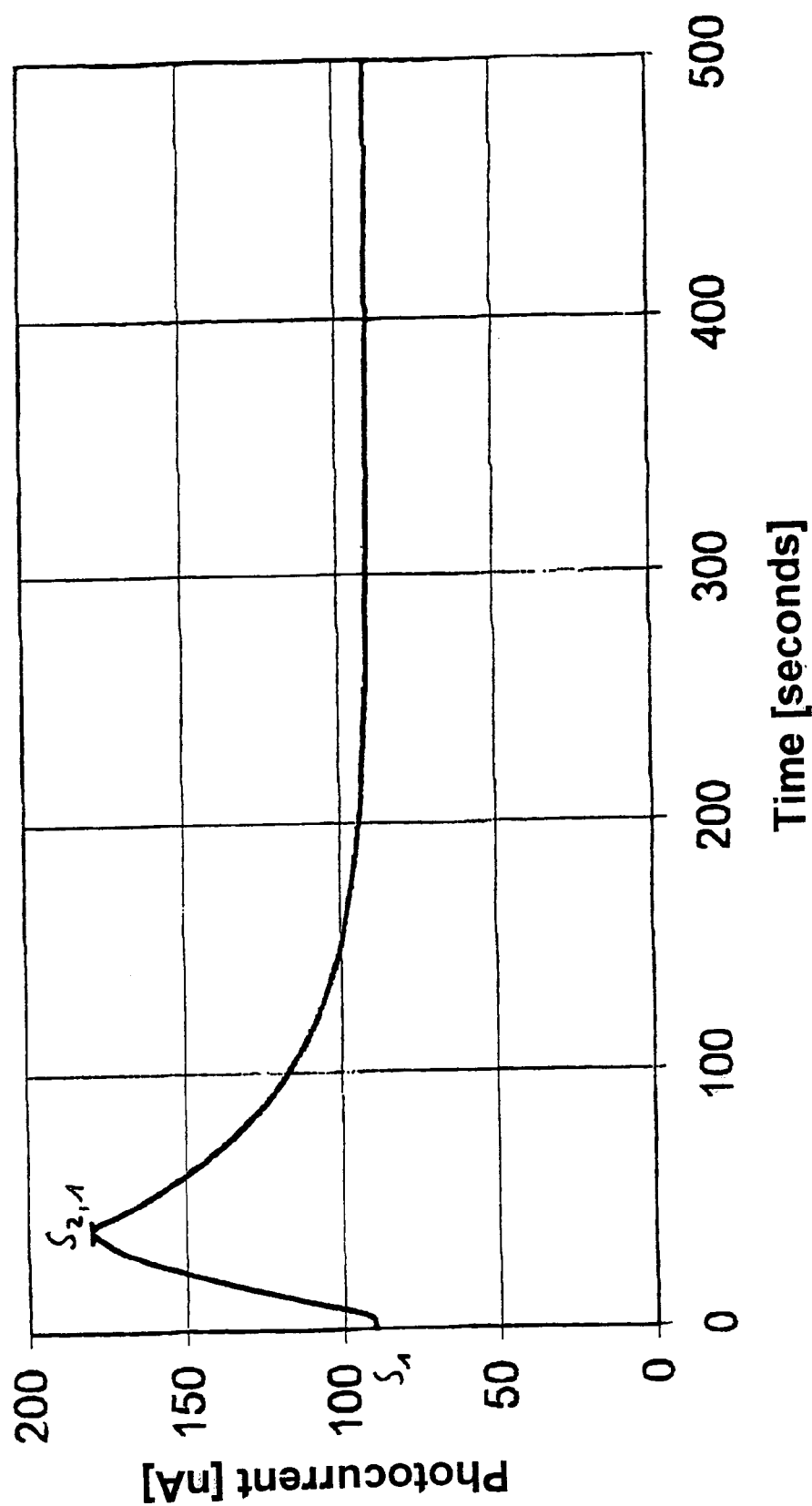
FIGS. 7–10 are controlled photocurrent curves for an optical element with a carbon surface susceptible to oxidation for four different curve positions of the electric field intensity.

In case 1 depicted in FIG. 7, the free interface 101 of the carbon surface layer is positioned at the reversal point of the curve of the electric field intensity of the standing wave. With increasing carbon growth the shape of the curve becomes that of FIG. 3. When the second threshold value $S_{2,i}$ is reached, however, the oxygen can be added only in metered doses to prevent complete oxidation of the cap layer, the thickness of which is to be maintained at 1 nm.

Figure 8:
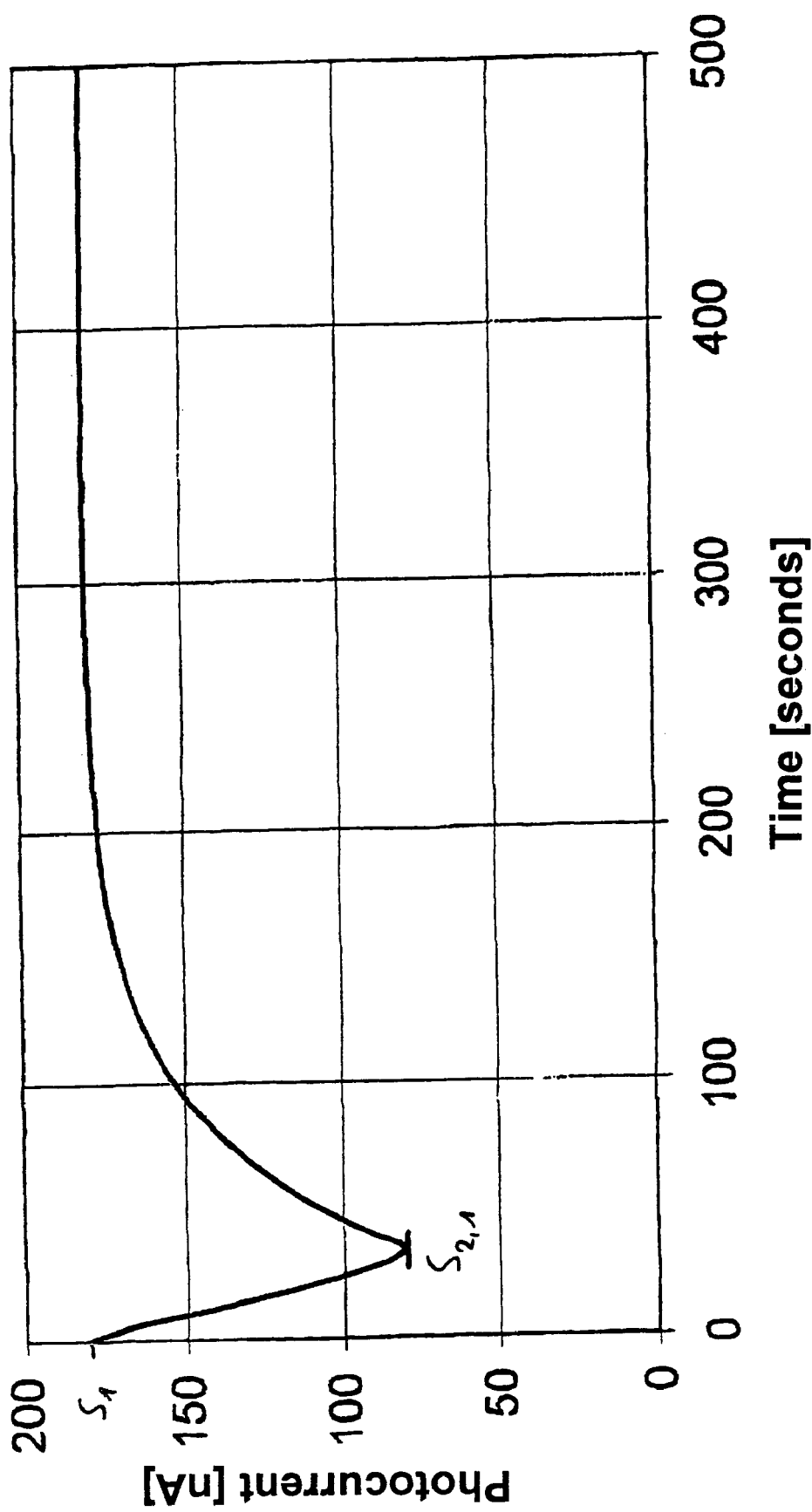

In case 2, which is illustrated in FIG. 8, the free interface of the carbon cap layer is positioned at the curve maximum of the electric field intensity of the standing wave. As a result of the growth of the carbon layer, the surface migrates out of this position. This is connected with a decrease in the photocurrent. The growth of the carbon material is also expressed in a reduction in the photoemission, which in the aggregate results in a strong decrease in the photocurrent curve. The curve continues to decrease until the threshold value $S_{2,1}$ is reached. Before or when the limit is reached, oxygen is added, which causes the carbon layer to decrease. Here, too, care must be taken that the carbon layer is not completely oxidized.

Figure 5:
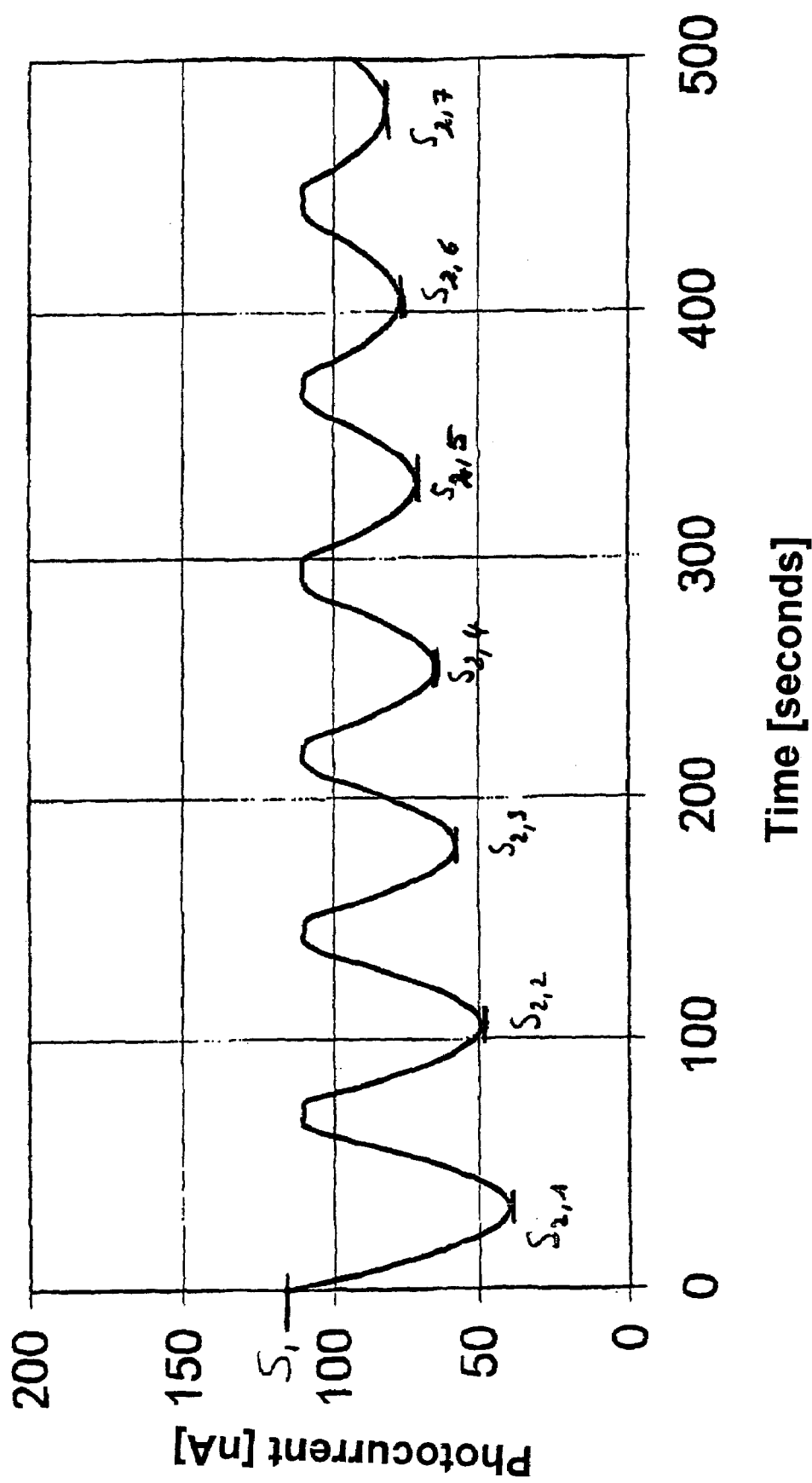
Figure 6:
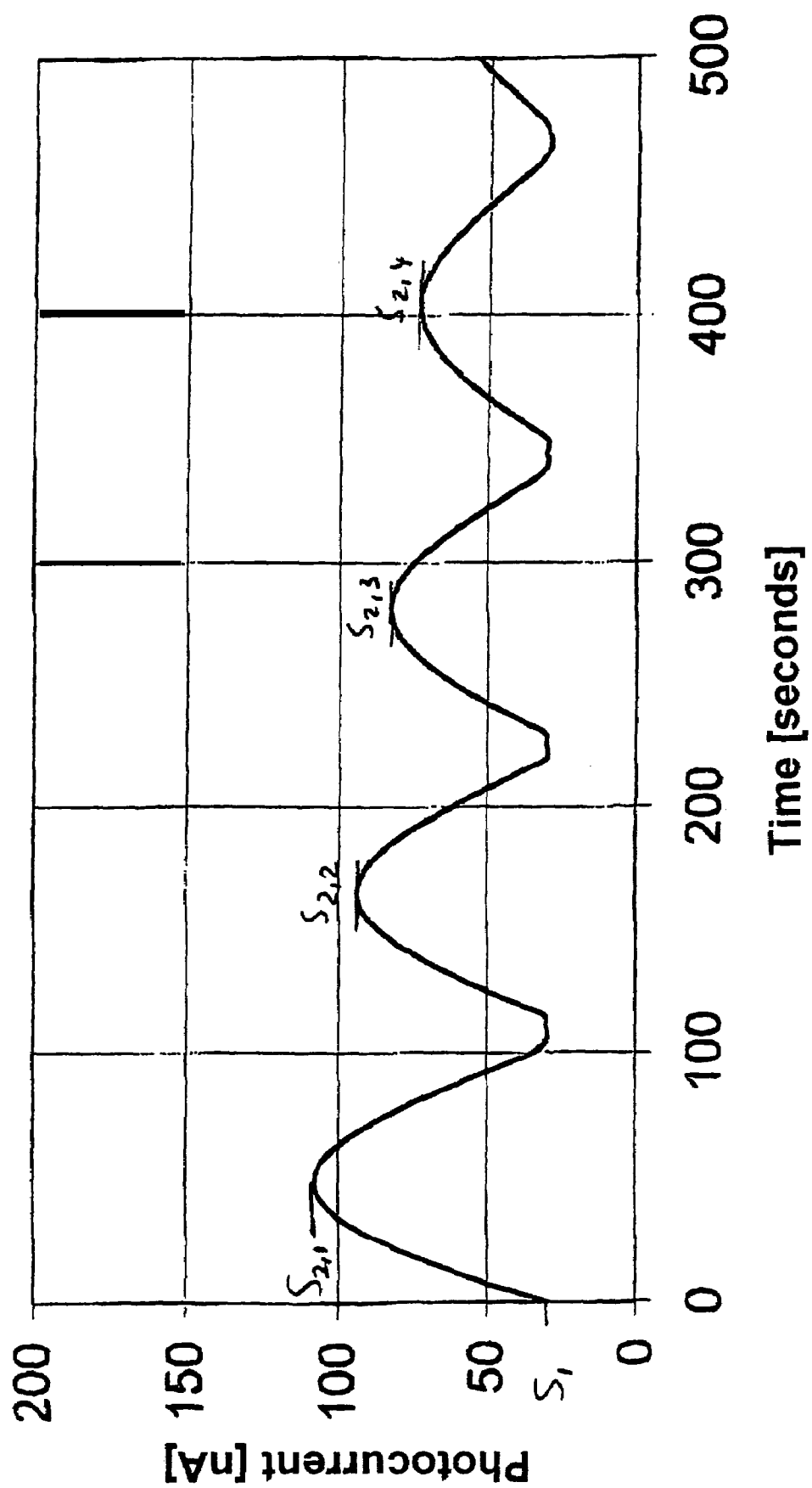
Figure 9:
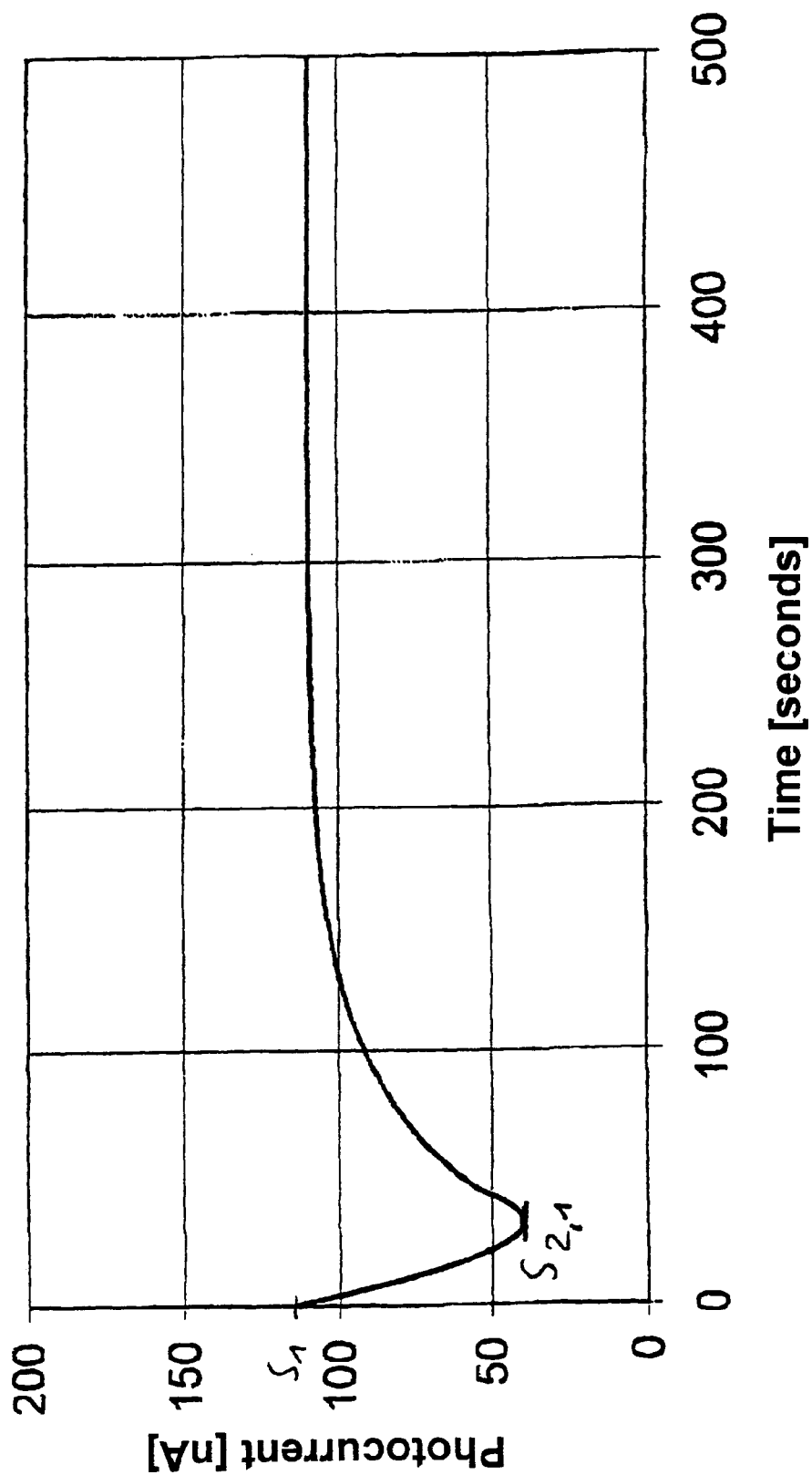
Figure 10:
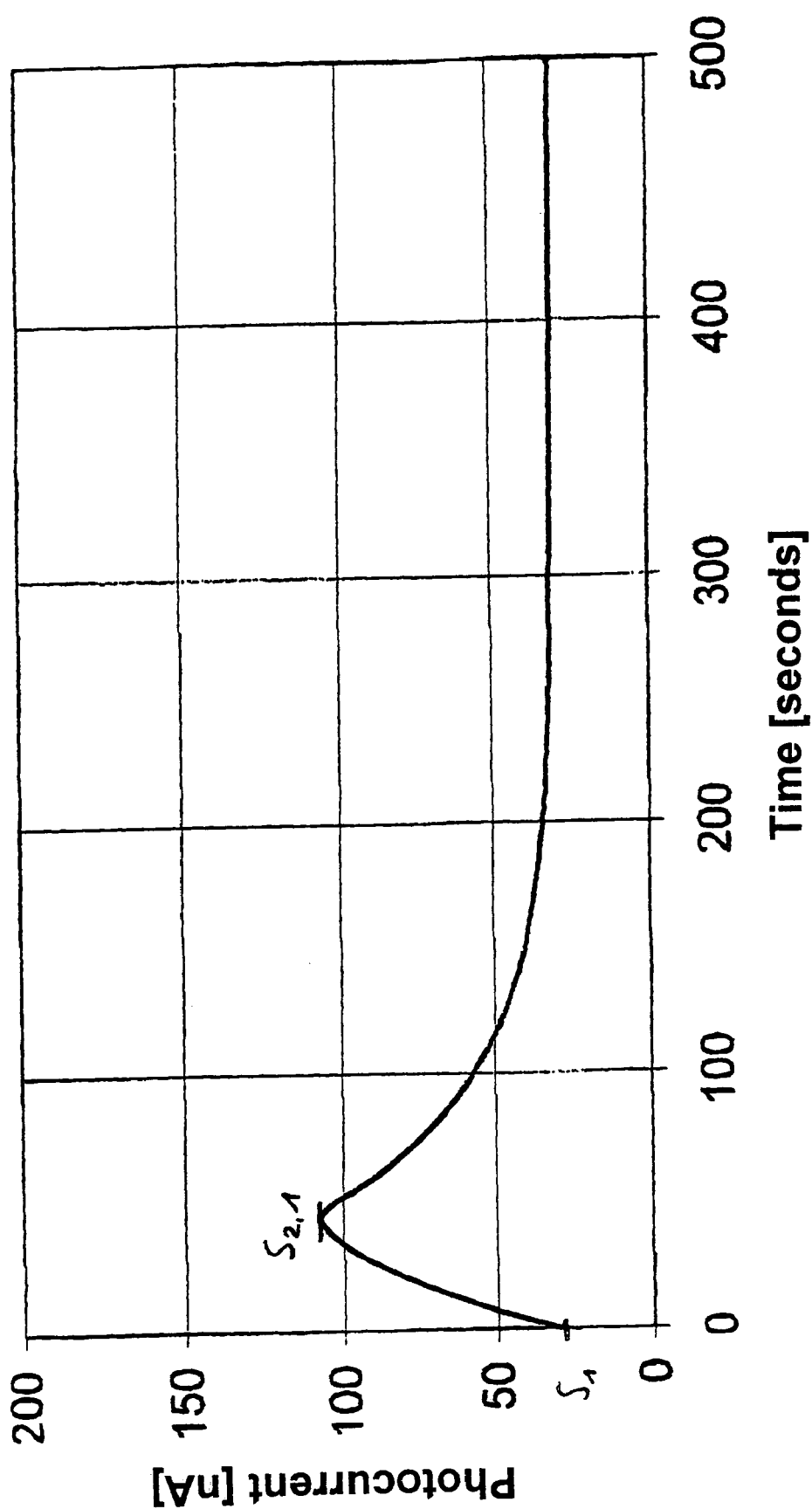
Figure 11:
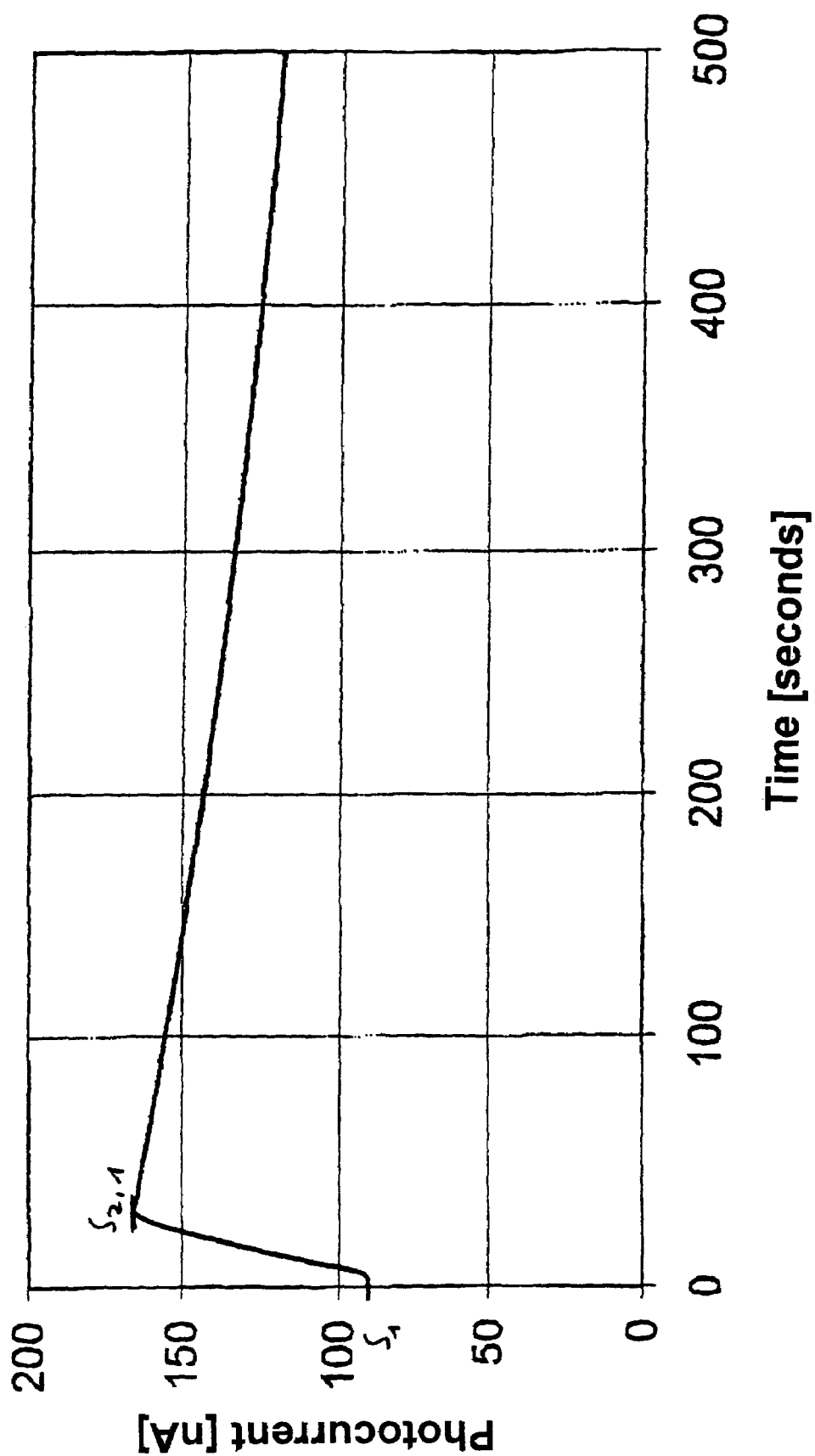
FIGS. 11–14 are controlled photocurrent curves for an optical element with a Si surface that is highly susceptible to oxidation for four different curve positions of the electric field intensity.
Figure 12:
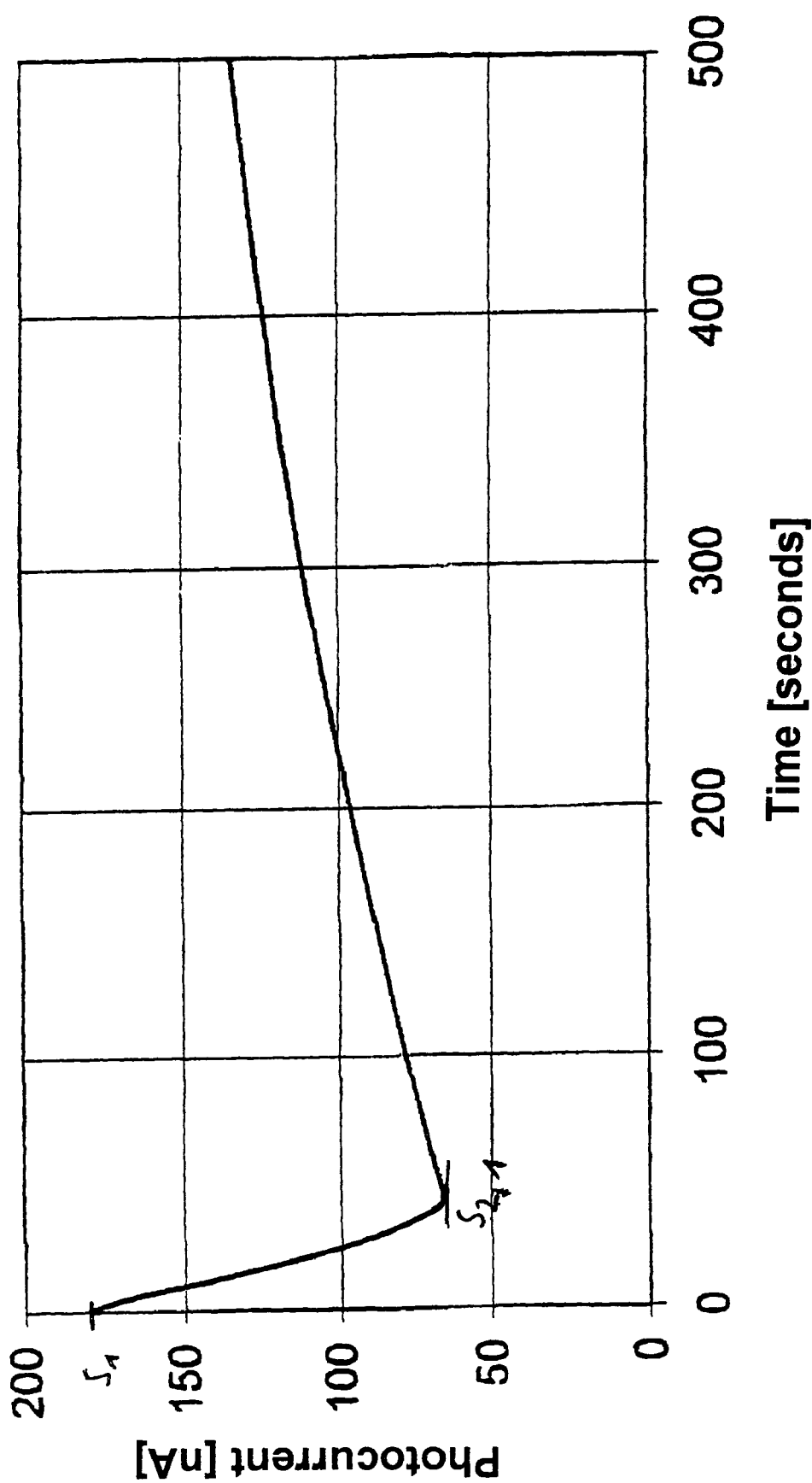
Figure 13:
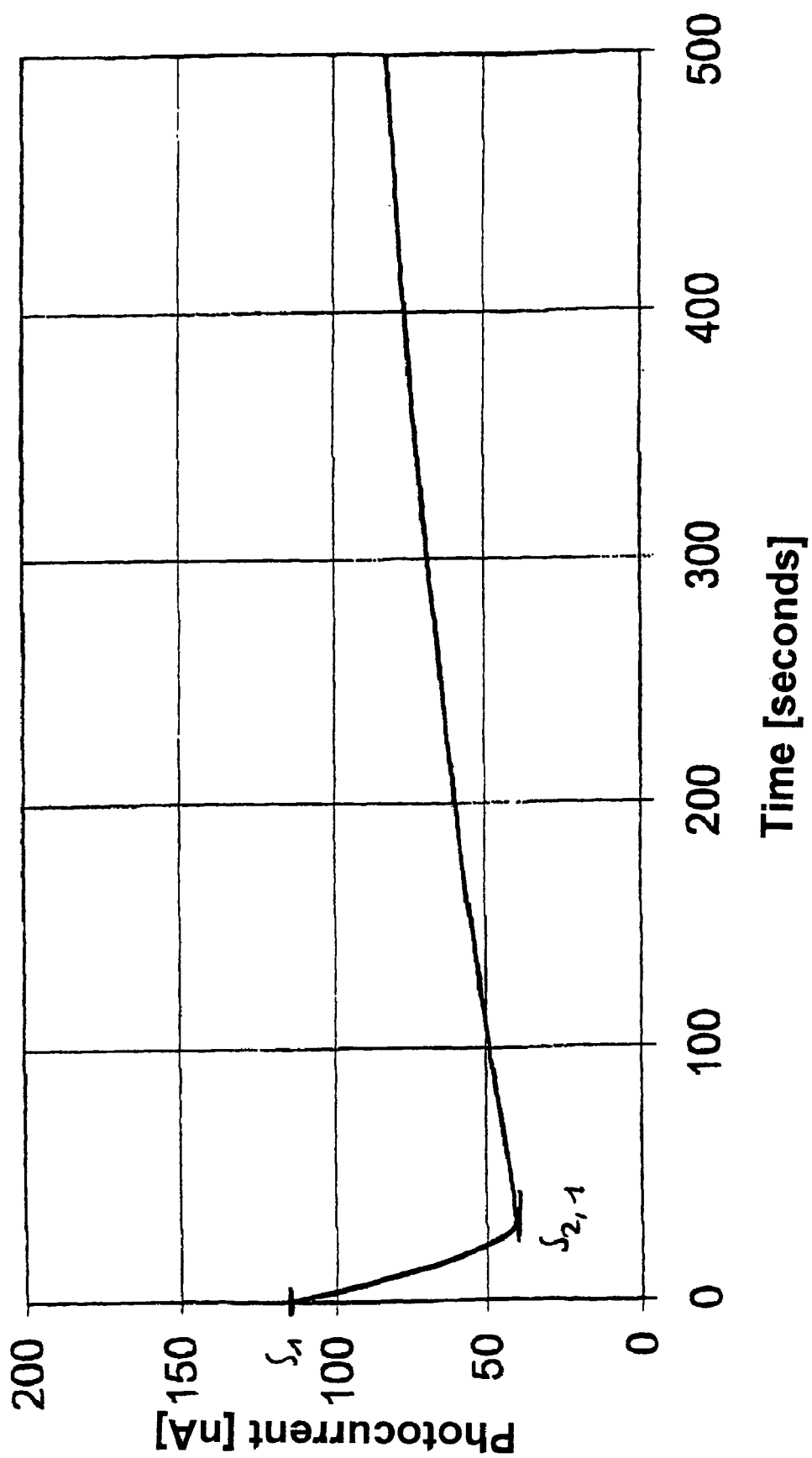
Figure 14:
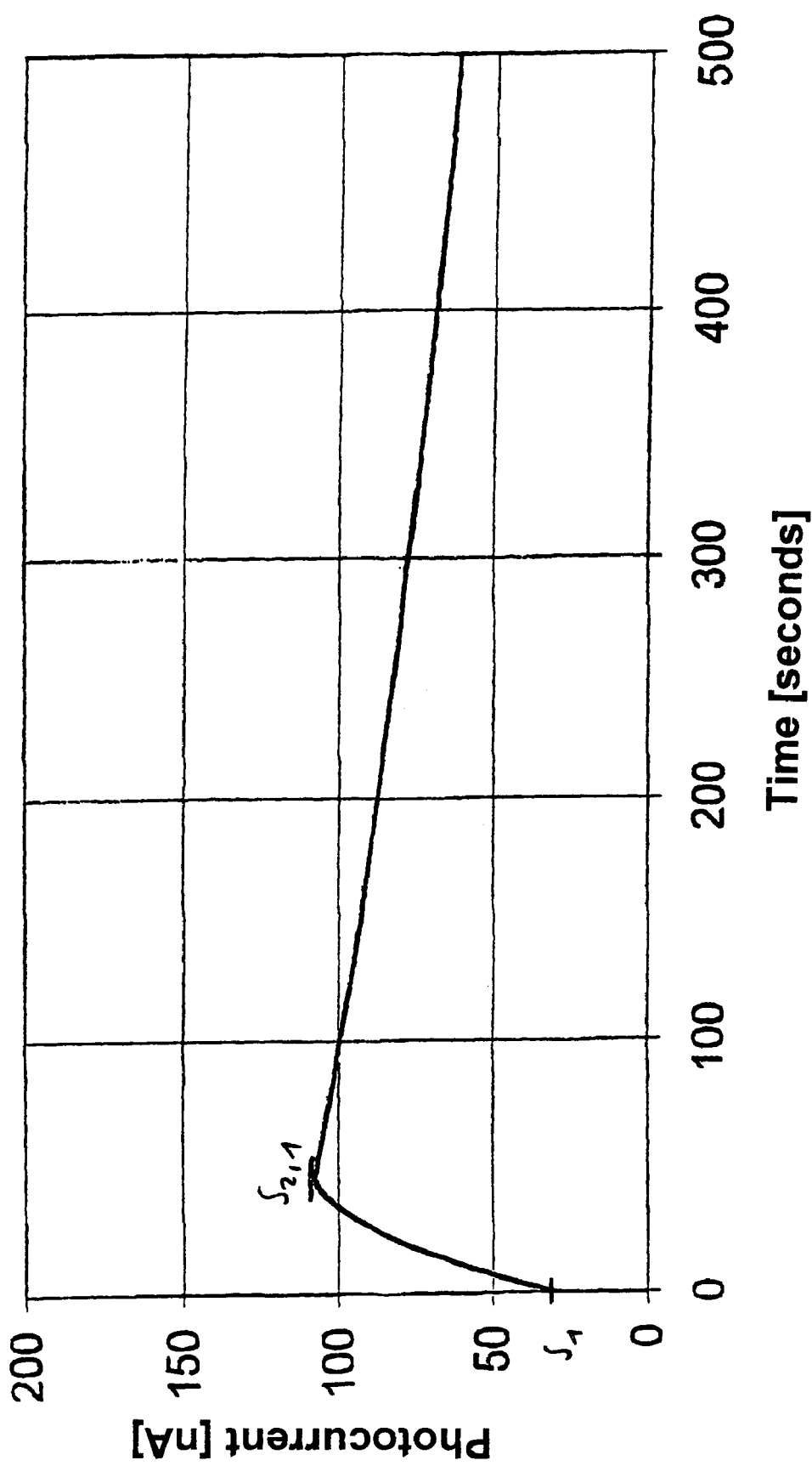

Cases 3 and 4, which are shown in FIGS. 9 and 10, correspond to the mechanisms illustrated and described in FIGS. 5 and 6.

None of the cases 1 to 4 show an oscillating photocurrent, because the feedback of the control loop must be weak to prevent complete oxidation of the carbon.

FIG. 11 to 14 relate to a multilayer system with a surface susceptible to oxidation, e.g., with a silicon layer. To prevent oxidation of the silicon surface, a carbonizing residual gas atmosphere was initially adjusted. The oxygen supply is initiated when the second threshold value $S_{2,i}$ is reached. It is subsequently slowly reduced, so that the threshold value $S_1$ cannot be reached, because that would be equivalent to the start of oxidation of the surface.

The photocurrent curves of FIGS. 11–14 each show an asymptotic characteristic.

To protect the Si surface, carbon-containing gas may be added even before the threshold value $S_1$ is reached. The carbon growth is subsequently removed again by the addition of an oxygen-containing gas. This would likewise result in an oscillating photocurrent curve.

Reference Numerals 1 device
2 optical element
3 vacuum chamber
5 evaluation unit
6 control unit
7 unit for measuring EUV intensity (multiple units may be installed locally)
8 residual gas analyzer
10 multilayer system
11 substrate
20 carbon layer
41 electron collector
42 ammeter
43 voltage source 71 gas feed (multiple units may be installed locally)
72 valve (multiple units may be installed locally)
100 free interface of multilayer system
101 free interface of carbon layer

The invention claimed is:

1. A method for preventing contamination on the surfaces of optical elements with a multilayer system during their exposure to EUV radiation at signal wavelength in an evacuated closed system having a residual gas atmosphere, comprising the steps of: measuring a photocurrent generated by photoemission from the radiated surface of the multilayer system, and using the photocurrent to control the gas composition of the residual gas, wherein the gas composition of the residual gas is altered as a function of at least one lower and one upper threshold value of the photocurrent.

2. The method as claimed in claim 1, wherein the threshold values of the photocurrent are selected from the range between a minimum photocurrent $I_{min}$ and a maximum photocurrent $I_{max}$, which occur when a minimum and a maximum of the electric field intensity of the standing wave, which forms in the multilayer system when the incident signal wavelength is reflected, lie in the free interface of the multilayer system.

3. The method as claimed in claim 1, further comprising the following steps:
a) measuring a first value of the photocurrent at the start of the EUV radiation after the subsidence of transient effects and storing this value as a first threshold value $S_1$,
b) defining at least one second threshold value $S_{2,i}$ for the photocurrent, where $i=1, 2, 3, \ldots$, such that $S_1 > S_{2,i}$ or $S_1 < S_{2,i}$,
c) measuring the photocurrent during the ongoing EUV radiation, and
d) controlling the gas composition during the radiation as a function of the measured photocurrent by supplying at least one gas to the closed system before or when the second threshold value $S_{2,i}$ is reached or exceeded and subsequently at least reducing the supply of this gas before or when the first threshold value $S_1$ is reached or exceeded.

4. The method as claimed in claim 1, further comprising the following steps:
a) measuring a first value of the photocurrent at the start of the EUV radiation after the subsidence of transient effects and storing this value as a first threshold value $S_1$,
b) defining at least one second threshold value $S_{2,i}$ for the photocurrent, where $i=1, 2, 3, \ldots$, such that $S_1 > S_{2,i}$ or $S_1 < S_{2,i}$,
c) measuring the photocurrent during the ongoing EUV radiation, and
d) controlling the gas composition during the radiation as a function of the measured photocurrent by supplying at least one gas to the closed system before or when the first threshold value $S_1$ is reached or exceeded and subsequently at least reducing the supply of this gas before or when the second threshold value $S_{2,1}$ is reached or exceeded.

5. The method as claimed in claim 1, wherein a gas is supplied which is already contained in the residual gas atmosphere, such that the partial pressure of this gas is changed.

6. The method as claimed in claim 1, wherein a gas is supplied which is not contained in the residual gas atmosphere before said supply.

7. The method as claimed in claim 1, wherein carbon monoxide, carbon dioxide, hydrogen, water, oxygen, nitrogen, $SF_6$, He, Ne, Ar, Kr, Xe, alkanes, alkenes, alkines, alcohols, ketones, aldehydes and/or other hydrocarbons, formic acid, acetic acid, propionic acid, hydrogen peroxide, hydrazine, $N_2O$, NO, $NO_2$, $SO_2$ and/or other oxygen-containing gases, F, Cl, Br, I, chloromethane, dichloromethane, trichloromethane, carbon tetrachloride, carbon tetrafluoride, fluoromethane, difluoromethane, ammonia, phosphine, antimony hydride, hydrogen fluoride, hydrogen chloride, hydrogen bromide, hydrogen iodide, boron fluoride, diborane, nitrogen trifluoride, hydrogen sulfide, hydrogen selenide, hydrogen telluride and other halogen/hydrogen-containing gases is/are supplied.

8. The method as claimed in claim 1, wherein a plurality of second threshold values $S_{2,i}$ are defined, where $|S_{2,i+1} - S_1| \leq |S_{2,i} - S_1|$ or $|S_{2,i+1} - S_{2,i}| \leq |S_{2,i} - S_{2,i-1}|$ where $i=1, 2, 3, \ldots$ 9. The method as claimed in claim 1, wherein before the EUV radiation, the position of the closest minimum and/or reversal point and/or the maximum (curve position) of the electric field intensity of the standing wave forming in the multilayer system when the incident signal wavelength is reflected is determined relative to the free interface of the multilayer system and the second threshold value $S_{2,i}$ is defined as a lower or an upper threshold value as a function of the curve position relative to the first threshold value $S_1$.

10. The method as claimed in claim 1, wherein in an optical element with a surface susceptible to oxidation, a carbonizing gas composition is adjusted prior to EUV radiation.

11. The method as claimed in claim 10, wherein a carbon-containing gas is supplied before the first threshold value $S_1$ is reached.

12. The method as claimed in claim 1, wherein the measured photoelectrons are converted into the time integral of the corresponding current.

13. The method as claimed in claim 1, wherein the gas is delivered in the proximity of the surface of the optical element.

14. A device for controlling contamination on a surface of at least one optical element during the exposure to EUV radiation, comprising: a detection unit for photoelectrons emitted by the optical element, an evaluation unit connected to the detection unit and a control unit connected to the evaluation unit and to a gas delivery unit wherein, the evaluation unit is configured to compare the measured photocurrent with at least two stored threshold values of the photocurrent and to supply threshold-dependent signals to the control unit.

15. An EUV lithographic device, comprising: optical elements, wherein a detection unit for photoelectrons is mounted in the proximity of at least one of the optical elements and is operatively linked to an evaluation unit, wherein a control unit is connected to the evaluation unit and is operatively linked to at least one gas delivery unit, wherein the evaluation unit is configured to compare a measured photocurrent with at least two stored threshold values of the photocurrent and to supply threshold-dependent signals to the control unit.

16. The device as claimed in claim 14, wherein the detection unit comprises an electron collector, comprising a detection ring or a detection network disposed above the surface of the optical element, which is arranged and/or configured in such a way that it does not affect the incident EUV radiation.

17. The device as claimed in claim 14, wherein the gas delivery unit has at least one gas feed.

18. The device as claimed in claim 17, wherein the gas feed is arranged adjacent to the surface of the optical element.

19. The device as claimed in claim 14, wherein a residual gas analyzer is connected to the evaluation unit.

20. The device as claimed in claim 14, wherein the evaluation unit and the control unit are combined into a closed-loop control unit.

21. A method for cleaning carbon-contaminated surfaces of optical elements by exposure to EUV radiation in an oxygen-containing atmosphere, comprising the steps of: measuring the photocurrent generated during radiation by photoemission from the surface to be cleaned and, if at least two predefined threshold values of the photocurrent are exceeded or fallen short of, supplying at least one gas or interrupting the supply of at least one gas.

* * * * *